United States Patent
Holmes et al.

(10) Patent No.: US 7,646,469 B2
(45) Date of Patent: *Jan. 12, 2010

(54) IMMERSION OPTICAL LITHOGRAPHY SYSTEM HAVING PROTECTIVE OPTICAL COATING

(75) Inventors: Steven J. Holmes, Guilderland, NY (US); Toshiharu Furukawa, Essex Junction, NY (US); Charles W. Koburger, III, Delmar, NY (US); Naim Moumen, Walden, NY (US)

(73) Assignee: International Business Machines Corporation, Armonk, NY (US)

( * ) Notice: Subject to any disclaimer, the term of this patent is extended or adjusted under 35 U.S.C. 154(b) by 97 days.

This patent is subject to a terminal disclaimer.

(21) Appl. No.: 11/899,085

(22) Filed: Sep. 4, 2007

(65) Prior Publication Data

US 2007/0296947 A1    Dec. 27, 2007

Related U.S. Application Data

(63) Continuation of application No. 11/163,007, filed on Sep. 30, 2005, now Pat. No. 7,495,743.

(51) Int. Cl.
*G03B 27/42* (2006.01)
*G03B 27/52* (2006.01)

(52) U.S. Cl. .................................. 355/53; 355/30

(58) Field of Classification Search ............ 355/30, 355/53, 67–69; 359/350, 355, 509
See application file for complete search history.

(56) References Cited

U.S. PATENT DOCUMENTS 7,495,743 B2 * 2/2009 Holmes et al. ............ 355/53

2005/0196632 A1 * 9/2005 Maschwitz et al. ........ 428/615
2006/0203218 A1 * 9/2006 Shirai et al. ................ 355/53

FOREIGN PATENT DOCUMENTS

DE    10 2004 059778 A1    8/2005

(Continued)

OTHER PUBLICATIONS

V. Liberman et al : "Assessment of Optical Coatings For 193-NM Lithography"; Proceedings of the Spie, Spie Bellingham, VA, US, vol. 3334, 1998, pp. 470-479.

(Continued)

*Primary Examiner*—Hung Henry Nguyen
(74) *Attorney, Agent, or Firm*—Todd M. C. Li; Wenjie Li; Daryl K. Neff

(57) ABSTRACT

An immersion lithography system is provided which includes an optical source operable to produce light having a nominal wavelength and an optical imaging system. The optical imaging system has an optical element in an optical path from the optical source to an article to be patterned thereby. The optical element has a face which is adapted to contact a liquid occupying a space between the face and the article. The optical element includes a material which is degradable by the liquid and a protective coating which covers the degradable material at the face for protecting the face from the liquid, the protective coating being transparent to the light, stable when exposed to the light and stable when exposed to the liquid.

17 Claims, 1 Drawing Sheet

FOREIGN PATENT DOCUMENTS

| | | |
|---|---|---|
| EP | 1 510 871 A | 3/2005 |
| EP | 1 571 700 A | 9/2005 |
| WO | WO 0177719 A | 10/2001 |
| WO | WO 03/077034 A | 9/2003 |
| WO | WO 2005/020298 * | 3/2005 |
| WO | WO 2005/119368 A2 | 12/2005 |

OTHER PUBLICATIONS

V. Liberman et al. "Long-Term 193-NM Laser Irradiation of Thin-Film-Coated CaF2 in the Presence of H2O"; Proceedings of the Spie, Optical Microlithography XVIII; vol. 5754, 2005, pp. 646-654.

International Search Report for PCT/EP2006/065995 (WO 2007/039374 A3) dated May 18, 2007.

* cited by examiner

IMMERSION OPTICAL LITHOGRAPHY SYSTEM HAVING PROTECTIVE OPTICAL COATING

CROSS-REFERENCE TO RELATED APPLICATION

This application is a continuation of U.S. application Ser. No. 11/163,007 filed Sep. 30, 2005, now U.S. Pat. No. 7,495,743, the disclosure of which is incorporated herein by reference.

BACKGROUND OF THE INVENTION

The invention relates optical lithography systems and more particularly to the structure and processing of such systems for use in optical immersion lithography.

One of the conditions necessary for the growth of the semiconductor industry is the ability to print ever smaller features on an integrated circuit (IC). However, recently, optical lithography is facing several challenges which may impede the further development of semiconductor technology. Investments have been made in techniques such as x-ray lithography and electron beam lithography as an alternative to traditional optical lithography. However, optical immersion lithography has garnered interest as potentially meeting the demands of improved semiconductor technology for printing smaller-sized features.

The size W of the minimum feature that may be printed with an optical lithography system is determined by the following equation:

$$W = k_1 \lambda / n \sin \alpha \qquad \text{Eq. 1;}$$

where $k_1$ is the resolution factor, $\lambda$ the wavelength of the exposing radiation and $n \sin \alpha$ is the numerical aperture ("NA") of the interfacial medium through which the exposing radiation is transmitted at the interface to the feature being printed.

As the minimum feature size W has been reduced in the development of semiconductor devices, the wavelength of the exposing radiation has also been reduced. However, the development of new exposing sources having further reduced wavelengths faces many challenges, as do the improvements in the design of optics required to transmit and focus the light from such reduced wavelength source.

Looking at Eq. 1 again, it can be seen that the minimum size W is also a function of the numerical aperture. The minimum size W becomes smaller when the numerical aperture becomes larger. The numerical aperture is quantified by $n \sin \alpha$, where n is the index of refraction of the interfacial medium between the lens and the feature being printed and a is the acceptance angle of the lens. Since the sine of any angle is always less than or equal to one and the index of refraction "n" is approximately equal to one when air is the interfacial medium, then replacing air with another medium increases the numerical aperture of the system. The medium should also meet other requirements. For example, the interfacial medium should have a low rate of optical absorption, be compatible and non-contaminating with respect to photoresist and lens materials, have uniform thickness and have uniform optical characteristics throughout. Water has a low rate of optical absorption, provides a uniform medium and is compatible with most photoresist materials.

However, the materials of which certain lenses and other optical elements are made can become degraded by contact with water. For example, the materials calcium fluoride and magnesium fluoride from which optical elements used with 193 nanometer exposure sources are made are somewhat soluble in water. Water contacting such optical elements degrades their optical characteristics. For that reason, water typically is not used as the immersion liquid with such optical elements.

Accordingly, it would be desirable to provide an optical immersion lithography system and method of forming an optical element thereof which permits water to be used as the immersion liquid.

SUMMARY OF THE INVENTION

An immersion lithography system is provided which includes an optical source operable to produce light having a nominal wavelength and an optical imaging system. The optical imaging system has an optical element in an optical path from the optical source to an article to be patterned thereby. The optical element has a face which is adapted to contact a liquid occupying a space between the face and the article, the optical element including a material degradable by the liquid and a protective coating covering the degradable material at the face for protecting the face from the liquid, the protective coating being transparent to the light, stable when exposed to the light and stable when exposed to the liquid.

In the immersion lithography system, the liquid preferably includes water, the degradable material includes a fluoride of an alkaline earth metal and the protective coating includes an oxide of at least one element selected from the group consisting of hafnium (Hf), silicon (Si), zirconium (Zr), aluminum (Al) and scandium (Sc).

For example, the protective coating can include a plurality of monolayers of the oxide in which a first monolayer overlies and contacts the fluoride and all other monolayers overlie and contact at least one other monolayer. Preferably, each of the monolayers has a thickness between about one angstrom and about two angstroms and the protective coating has a thickness of about 30 angstroms. Preferably, the nominal wavelength is either 157 nanometers or 193 nanometers. In accordance with a preferred aspect of the invention, the liquid includes water, the optical element includes at least one fluoride of an alkaline earth metal and the protective coating includes at least one nitride of an alkaline earth metal.

In accordance with a particular aspect of the invention, the optical element includes calcium fluoride and the protective coating includes calcium nitride.

In one aspect of the invention, the optical element includes magnesium fluoride and the protective coating includes magnesium nitride.

In accordance with a particular aspect of the invention, the protective coating includes a mixture of the fluoride and the nitride. For example, the protective coating includes a mixture of calcium nitride and calcium fluoride.

In accordance with one or more aspects of the invention, a method is provided of forming an optical element of an immersion lithography system used to focus light from an optical source in which the optical element has a face adapted to contact a liquid that occupies a space between the face and an article to be patterned by the immersion lithography system. In such method, the optical element includes a material that is degradable by the liquid, and the method includes forming a protective coating to cover the degradable material at the face to protect the face from the liquid, the protective coating being transparent to the light, stable when exposed to the light and stable when exposed to the liquid.

In accordance with one or more further aspects of the invention, the optical element includes a fluoride of an alkaline earth metal and the step of forming the protective coating includes forming an oxide of at least one metallic material selected from the group consisting of hafnium (Hf), silicon (Si), zirconium (Zr), aluminum (Al) and scandium (Sc) by exposing the optical element to a source of oxygen and a vapor source of the metallic material.

In accordance with one or more further aspects of the invention, the step of forming the protective coating includes successively forming a plurality of monolayers of the oxide including a first monolayer of the plurality of monolayers in contact with the fluoride at a surface of the optical element.

In accordance with one or more further aspects of the invention, the step of forming the first layer includes forming hydroxyl functionalities at the surface of the optical element and reacting the hydroxyl functionalities with the vapor source of the metallic material to form the oxide. In one example, the hydroxyl functionalities are formed by exposing the fluoride at the surface of the optical element to water vapor. The vapor source of the metal may include a chloride of the metallic material.

In accordance with a particular aspect of the invention, the liquid includes water, the optical element includes at least one fluoride of an alkaline earth metal and the step of forming the protective coating includes forming at least one nitride of at least one alkaline earth metal on a surface of the optical element.

In accordance with one or more aspects of the invention, the step of forming the protective coating further includes forming a mixture of the fluoride and the nitride.

In accordance with a particular aspect of the invention, the step of forming the protective coating includes plasma implanting nitrogen into a surface of the optical element. Preferably, the step of forming the protective coating further includes providing silane to a chamber in which the plasma implanting is performed into the surface.

In accordance with a particular aspect of the invention, the step of forming the protective coating further includes annealing the optical element. Preferably, the annealing includes exposing the optical element to a source of light having a wavelength between about 100 nanometers and 200 nanometers.

In accordance with a particular aspect of the invention, the step of forming the protective coating includes exposing the surface of the optical element to a source of ammonia and a diketonate of at least one alkaline earth metal.

In accordance with a particular aspect of the invention, the step of forming the protective coating includes successively forming a plurality of monolayers, each monolayer including a nitride of at least one alkaline earth metal, the plurality of monolayers including a first monolayer of the plurality of monolayers in contact with the fluoride at the surface of the optical element.

In accordance with a particular aspect of the invention, the step of forming the protective coating includes a step of reacting an alkaline earth metal present at the surface of the optical element with an azide and a step of causing the azide to decompose to form the nitride, the nitride including a nitride of at least one alkaline earth metal in the fluoride. Preferably, the steps of reacting the alkaline earth metal with the azide and of causing the azide to decompose are repeated in succession.

In accordance with one or more aspects of the invention, a method is provided of forming an optical element of an immersion lithography system used to focus light from an optical source, the optical element having a face adapted to contact a liquid occupying a space between the face and an article to be patterned by the immersion lithography system, and in which the optical element includes a material degradable by the liquid. In such method, a nitrogen-containing species is spray deposited onto a surface of the optical element to form a protective coating covering the degradable material at the face, the protective coating including a nitride of an alkaline earth metal and being transparent to the light, stable when exposed to the light and stable when exposed to the liquid.

In accordance with one or more particular aspects of the invention, the protective coating is annealed by exposing optical element to at least one source of energy selected from the group consisting of a thermal source, an optical source and an electron beam source.

In accordance with one or more aspects of the invention, a method is provided of forming an optical element of an immersion lithography system used to focus light from an optical source, the optical element having a face adapted to contact a liquid occupying a space between the face and an article to be patterned by the immersion lithography system, and in which the optical element includes a material degradable by the liquid. Such method includes successively forming each of a plurality of monolayers including a nitride of an alkaline earth metal on the optical element to form a protective coating covering the degradable material at the face, the protective coating being transparent to the light, stable when exposed to the light and stable when exposed to the liquid.

DETAILED DESCRIPTION

Figure 1:
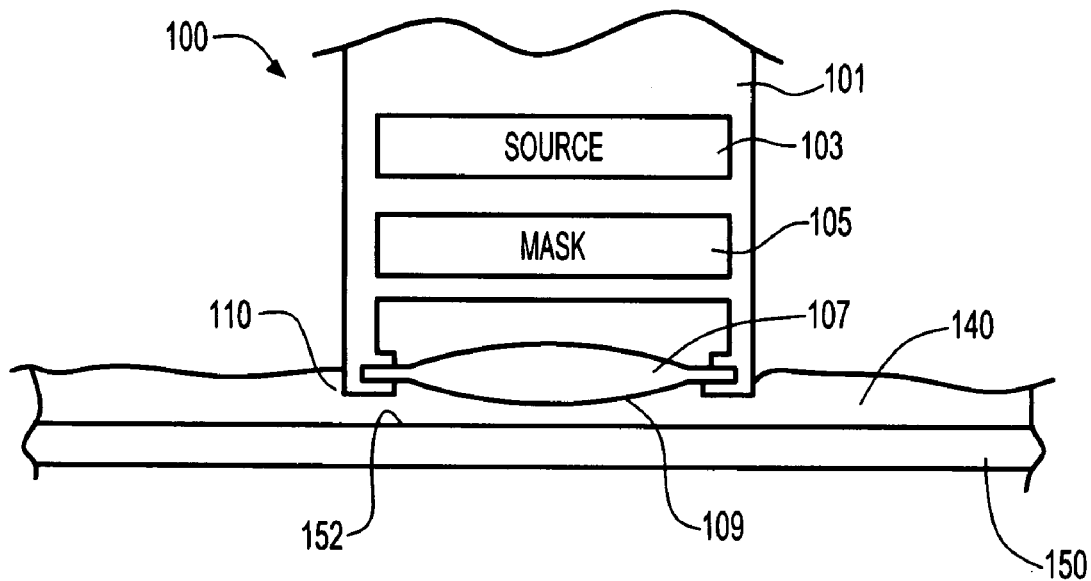
FIG. 1 is a sectional view illustrating an immersion lithography system in accordance with an embodiment of the invention.

FIG. 1 is a sectional view illustrating an exemplary immersion lithography system 100 in accordance with one embodiment of the invention. As shown in FIG. 1, the immersion lithography system 100 includes an optical imaging system 101 including an optical source 103, and an optical element 107. A photomask or "mask" 105 is mounted to a platform of the optical imaging system. The optical source 103 is used to produce light for projecting an image of a mask 105 (also sometimes referred to as a "reticle") onto an article 150 such as a semiconductor wafer or other article having an exposed photolithographically imageable surface. Illustratively, the optical source produces light having a nominal wavelength of 248 nanometers, 193 nanometers or 157 nanometers. The optical element 107 is used to cast an image of the mask onto the article 150. Typically, the optical imaging system 100 includes a series of optical elements, e.g., focusing lenses, corrective lenses, collimators, filters, etc., which cooperate together in casting the image onto the article. Optical element 107 represents one such optical element at or near a lower extremity 110 of the optical imaging system 101. As illustrated in FIG. 1, imaging light directed towards the article 150 exits the optical imaging system 101 through a face 109 of the optical element 107. An exemplary optical element 107 takes a form of a convex lens. However, the face 109 of the optical element may have any of a flat, concave or convex shape. Alternatively, the face 109 may include one or more of a flat portion, a concave portion and/or a convex portion.

FIG. 1 illustrates use of the immersion lithography system 100 to cast an image onto a photo-imageable surface 152 of an article 150, e.g., a semiconductor wafer or other lithographically patternable article. The immersion lithography system projects the image of the mask onto the article through a liquid 140 which occupies a space between the face 109 of the optical element 107 and the article 150. Illustratively, the liquid 140 entirely covers the surface 152 of the article 150. As illustrated in FIG. 1, the face 109 of the optical element 107 contacts the liquid. Preferably, the face is submerged within the liquid, i.e., fully contacted by the liquid such that the liquid is present over the entire face 109 and the liquid completely fills the space between the face 109 and the photoimageable surface 152.

Figure 2:
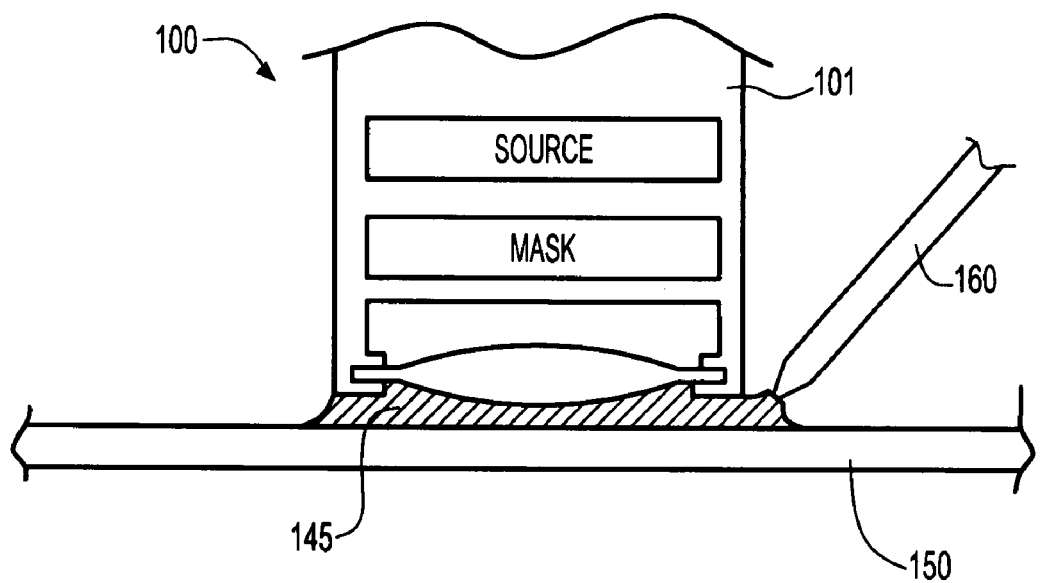
FIG. 2 is a sectional view illustrating an immersion lithography system in accordance with another embodiment of the invention.

FIG. 2 illustrates a variation of the immersion lithography system 100 in which the immersion liquid 140 does not cover the entire article but merely fills an interfacial region 145 between the face 109 of the optical element and the article 150. In such a system, water is dispensed by a supply tube 160 located just to the side of the optical imaging system 101. Movement of the article relative to the imaging system causes the interfacial region 145 between the optical imaging system and the article to remain filled with the liquid 140. Typically, the immersion lithography system 100 also includes a mechanism (not shown) which uses vacuum or other force to remove the liquid at an edge of the optical imaging system 101 opposite the edge of the imaging system to which the liquid is dispensed.

In a preferred embodiment, the optical source produces light having a nominal wavelength of 193 nanometers and the optical element 107 is optimized for the 193 nanometer wavelength. Illustratively, the optical element includes a material such as a fluoride of an alkaline earth metal, these metals being the Group II elements of beryllium (Be), calcium (Ca), magnesium (Mg), strontium (Sr) and barium (Ba). Optical elements for the 193 nm wavelength are commonly made from calcium fluoride or magnesium fluoride, such material having optical characteristics especially suited to the 193 nanometer wavelength. In such embodiment, the liquid 140 preferably includes water, the liquid more preferably consisting essentially of purified water, because of its low cost, ready availability and high uniformity. In addition, the index of refraction of water, being 1.43, makes water well suited for use as the immersion liquid.

However, fluorides of alkaline earth metals are degradable by contact with water. For example, calcium fluoride ($CaF_2$) and magnesium fluoride ($MgF_2$) are soluble to some degree in liquids such as water. For protection from the liquid, the optical element includes a protective coating at the face 109 which covers the fluoride material. The protective coating prevents contact between the liquid (e.g., water) and a material of the optical element which is degradable by the liquid. However, the protective coating is required to be durable when in contact with the liquid and when exposed to the light used to cast the image on the article. Stated another way, the protective coating is stable when exposed to the liquid and is stable when exposed to the light passing through the optical element 107 from the source 103. In addition, the protective coating is required to have good optical properties, e.g., to be transparent to the light used to cast the image, and to not introduce excessive distortion to the image. Accordingly, the protective coating should have good uniformity, i.e., have uniform thickness and uniform properties such as index of refraction and rate of absorption throughout the area and the thickness of the protective coating on the optical element. In addition, the protective coating should preferably be well-suited to the wavelength of the light from the optical source, i.e., have properties enabling it to uniformly pass the light from the optical source 103 which passes through the optical element 107.

In one example, the coating includes a series of successively deposited monolayers of an oxide. Such oxide is preferably a transparent oxide having good compatibility with the fluoride material and good characteristics relative to the immersion liquid, e.g., water. For example, such coating can include a series of successively deposited monolayers of an oxide of a material selected from the group consisting of hafnium (Hf), silicon (Si), zirconium (Zr), aluminum (Al) and scandium (Sc). Preferably, in such example, each of the deposited monolayers has a thickness of between about one angstrom and two angstroms. Preferably, a first monolayer of the oxide is formed on an exposed surface of the alkaline earth metal fluoride material. Thereafter, each subsequently deposited monolayer is formed in contact with one or more of the monolayers deposited prior to that particular monolayer.

In an exemplary process, each monolayer is deposited by providing a source of oxygen to an exposed surface of the optical element and thereafter providing a vapor source of the metal, i.e., such as one or more of hafnium, silicon, zirconium and aluminum. The metal vapor combines with the oxygen at the surface to form the oxide. In a particular embodiment, hydroxyl functionalities are formed on an surface of the optical element and the hydroxyl functionalities are then reacted with the vapor source of the metal to form the oxide monolayer. For example, hydroxyl functionalities can be formed on a surface containing calcium fluoride or magnesium fluoride material by exposing the surface of the optical element to water vapor. The hydroxyl functionalities can then be converted to the metal oxide by exposing that surface to a chloride of the metal, e.g., $HfCl_4$. Thus, a monolayer of the metal oxide is formed on the surface of the calcium fluoride or magnesium fluoride by sequentially exposing the surface of the fluoride to a source of hydroxyl functionalities and a vapor source of the metal. Likewise, in the successive deposition of additional monolayers, each monolayer is formed on the surface of the last previously deposited metal oxide layer by sequentially exposing the surface of the fluoride to a source of hydroxyl functionalities and a vapor source of the metal. Another way that water-insoluble films can be formed is by aluminum-catalyzed growth of silicon oxide films in a manner as described in U.S. Patent Publication No. 2004/0043149. The techniques described therein can also be used to uniformly deposit hafnium oxides, hafnium silicates, zirconium oxides, scandium oxides, and other similar compounds.

In another example, when the optical element includes a material such as a fluoride of an alkaline earth metal, the coating may include a nitride of one or more alkaline earth metals. Such nitride is preferably a transparent nitride having good compatibility with the fluoride material and good characteristics relative to the immersion liquid, e.g., water. Specifically, such nitride is insoluble in water. In such example, the nitride can be, but need not be a nitride of the same alkaline earth metal the fluoride of which is included in the optical element. For example, when the optical element includes calcium fluoride or magnesium fluoride, the protective coating preferably includes one or more nitrides of calcium, magnesium, barium or strontium.

In a particular preferred embodiment, the protective coating includes a nitride of the same alkaline earth metal of which the optical element includes its fluoride. In such example, the nitride is preferably grown by reaction of the alkaline earth metal fluoride included at the surface of the optical element with nitrogen under appropriate conditions.

Specifically, in such example, when the optical element includes or consists essentially of a material such as calcium fluoride, the protective coating can include or consist essentially of calcium nitride. In a variation of such example, when the optical element includes or consists essentially of a material such as magnesium fluoride, the protective coating can include or consist essentially of magnesium nitride. Preferably, the thickness of the resulting nitride coating is between about 10 nanometers (nm) and 50 nm.

An exemplary process of making such nitride includes plasma immersion ion implantation. Such process implants a species of nitrogen into the surface of the optical element using nitrogen gas or ammonia vapor, for example, as a source of nitrogen to create a nitrogen plasma. In such process, fluorine at the surface of the optical element is scavenged by nitrogen, carrying away the fluorine in form of $NF_3$ gas as a side product of the reaction which forms the nitride of the alkaline earth metal.

In a particular preferred embodiment, it may be desirable to add a silane ($SiH_4$) component to the nitrogen plasma. Fluorine at the surface of the optical element is scavenged by silicon to form $SiF_4$. The bond between silicon and fluorine is strong and stable. Therefore, this process effectively sequesters the scavenged fluorine from further reaction with the calcium or magnesium exposed at the surface of the optical element. Silane is preferably provided to the mixture of gases present in the chamber in a concentration ranging between about one and about ten percent relative to the concentration of the gaseous source of nitrogen in the chamber. Such process may result in some incorporation of silicon at the surface of the optical element, typically in form of silicon nitride. The incorporated silicon nitride may further serve to passivate the protective coating. As a result of such process, a coating is produced which includes one or more films that contain a nitride of an alkaline earth metal and which may also contain silicon nitride. During the implantation process, the uniformity of the coating depends upon the uniformity of the electric field that is used to drive ions from the nitrogen-containing plasma into the optical element. As the electric field can be controlled well over a relatively large area, a coating having uniform characteristics (uniform thickness, and spatial compositional uniformity) can be achieved to a level of angstroms.

Following the plasma implantation process, the optical element is preferably subjected to annealing, e.g., by maintaining the optical element for a period of time at a temperature ranging between about 200 and 700 degrees Celsius. The annealing process densifies the coating the resulted from the plasma implantation process to improve its qualities.

Alternatively, the coating can be densified through optical annealing, e.g., such as by exposure to a source of ultraviolet light, for example, ultraviolet light having a wavelength between about 100 nanometers (nm) and 200 nm.

In yet another embodiment, a coating containing one or more nitrides of alkaline earth metals can be formed by chemical vapor deposition. In such embodiment, a film containing a nitride of an alkaline earth metal, e.g., barium, strontium, calcium or magnesium, is deposited from a mixture of gases including ammonia and bis(beta-diketonates) of the ion of the metal. During such process, the diketonate of the metal is heated to a temperature between about 150 and 250 degrees Celsius as a metal vapor source for the deposition, with ammonia gas being present in the chamber at the time. The metal vapor is carried to the surface of the optical element where reaction occurs with the ammonia gas to deposit the nitride of the metal. This process can be repeated using a diketonate of the same alkaline earth metal or of a different alkaline earth metal until a series of films are formed to the thickness desired for the coating.

Alternatively, an atomic layer deposition process can be used. Atomic layer depositions can produce highly uniform coatings by virtue of the coating being produced one atomic layer at a time to a thickness of about 10 to about 20 atomic layers. In one such process, the optical element is treated first with ammonia vapor. This treatment can be performed in the presence of a plasma or not in the presence of a plasma. This results in the "amination" of the surface of the optical element, i.e., ammonia molecules becoming bound to the surface of the optical element. Thereafter, a vapor source of a diketonate of an alkaline earth metal such as described above is carried to the surface of the optical element by a carrier gas which includes a non-reactive amine, e.g., trimethyl amine. The metal contained in the diketonate vapor reacts with the surface-bound ammonia to create a monolayer of metal nitride. These treatments of ammonia followed by the metal diketonate are repeated sequentially a number of times to produce a coating containing sufficient monolayers of the metal nitride to reach a desired thickness, e.g., a thickness between about 10 and 20 nanometers.

In such process, the coating can be formed to contain some monolayers which include a nitride of a particular alkaline earth metal such as calcium, while other monolayers include the nitride of another alkaline earth metal, for example, magnesium, barium or strontium. Any combination is possible. Alternatively, one or more of the monolayers may include nitrides of two or more alkaline earth metals in a particular ratio, and another one or more monolayers may include such nitrides of two or more alkaline earth metals in a different ratio.

In a particular preferred embodiment, the protective coating can include a mixture of the nitride of the alkaline earth metal of which the optical element includes its fluoride, together with a small percentage (either mole percentage or weight percentage) of the fluoride of that alkaline earth metal. The mole or weight percentage that is optimum depends on the desired balance to be struck between optical transmission and solubility of the film in the immersion fluid. Higher nitrogen content is desirable to reduce solubility. On the other hand, higher fluoride content is desirable to enhance optical transmission. The selection of the operating point depends on the degree of transmission and degree of solubility resistance that are needed. Since these characteristics also depend on the selected thickness of the film, it is not possible to specify a percentage nitride content and percentage fluoride content that are optimum for all conditions.

An optical element prior to being coated can consist essentially of calcium fluoride. In such example, the protective coating can include a mixture containing 5 to 25% calcium fluoride by weight and the remaining percentage being calcium nitride. In such example, the fluoride can be incorporated into the alkaline earth metal nitride by providing hydrofluoric acid (HF) in the chamber during the deposition of the metal nitride. Subsequent to their formation, the nitride films can be densified, e.g., as by thermal or optical annealing such as described above.

In another example of atomic layer deposition, a thin layer of nitride can be formed by reaction of hydrogen azide ($HN_3$) with calcium fluoride or magnesium fluoride present at the surface of the optical element. In this reaction, the azide reacts with the metal fluoride to produce hydrofluoric acid (HF) as a volatile byproduct, binding the azide functionality to the metal. The azide is then caused to decompose, either by heating or irradiating the optical element with light. This then releases nitrogen gas ($N_2$) as a stable byproduct, leaving a reactive nitrene species bound to the metal. The nitrene then re-arranges to create the metal nitride. The azide treatment can be repeated several times in order to grow a uniform coating of nitride on the surface of the optical element. Thereafter, the nitride coating can be densified, e.g., through thermal or optical annealing.

In yet another embodiment, jet vapor deposition is used to deposit the coating of calcium nitride or magnesium nitride. Jet vapor deposition techniques are described in U.S. Pat. Nos. 4,788,082; 5,256,205; 5,356,672; 5,356,673; and 5,759,634. In this embodiment, a vapor containing a species of the alkaline earth metal is spray deposited from a "jet" in an ambient containing one or more of nitrogen plasma or ammonia vapor to directly create a nitride film of the alkaline earth metal. At low deposition rates, this method can achieve thin films having high uniformity, as a series of successively deposited monolayers. Such method has been used in other contexts, e.g., in processes to fabricate the gate dielectric of a transistor, resulting in highly uniform films having a thickness of 10 to 15 angstroms, with thickness controlled to a precision between about one and two angstroms.

In yet another embodiment, calcium or magnesium nitride can be sputter deposited onto the optical element, following by thermal or optical annealing. Deposition by sputtering is less desirable than the other methods described above because of possible variations that may occur in the thickness of the coating across the optical element.

While the invention has been described in accordance with certain preferred embodiments, those skilled in the art will understand the many modifications and enhancements which can be made thereto without departing from the true scope and spirit of the invention, which is limited only by the claims appended below.

The invention claimed is:

1. An immersion lithography system, comprising:
    an optical source operable to produce light having a nominal wavelength; and
    an optical imaging system including an optical element in an optical path from said optical source to an article to be patterned by said optical imaging system, said optical element having
    a face adapted to contact a liquid including water occupying a space between said face and the article;
    a fluoride of an alkaline earth metal at said face, said fluoride being degradable by the liquid; and
    a protective coating including at least one nitride of the alkaline earth metal, said protective coating covering said fluoride at said face to protect said face from the liquid, said protective coating being transparent to the light, stable when exposed to the light and stable when exposed to the liquid.

2. The immersion lithography system as claimed in claim 1, wherein said protective coating has a thickness in the optical path between the fluoride and the liquid of between about 10 nanometers and about 50 nanometers.

3. The immersion lithography system as claimed in claim 1, wherein the nominal wavelength is 193 nanometers.

4. The immersion lithography system as claimed in claim 1, wherein said protective coating includes a mixture of said fluoride and said nitride.

5. The immersion lithography system as claimed in claim 1, wherein said optical element includes calcium fluoride and said protective coating includes calcium nitride.

6. The immersion lithography system as claimed in claim 5, wherein said protective coating includes a mixture of calcium nitride and calcium fluoride.

7. The immersion lithography system as claimed in claim 1, wherein said optical element includes magnesium fluoride and said protective coating includes magnesium nitride.

8. The immersion lithography system as claimed in claim 7, wherein said protective coating includes a mixture of magnesium nitride and magnesium fluoride.

9. A method of forming an optical element of an immersion lithography system used to focus light from an optical source, the optical element having a face adapted to contact a liquid including water occupying a space between the face and an article to be patterned by the immersion lithography system, the method comprising:
    providing an optical element including a fluoride of an alkaline earth metal at a surface of the optical element, the fluoride being degradable by the liquid; and
    forming a protective coating covering the fluoride at the surface to protect the face of the optical element from the liquid, the protective coating including a nitride of the alkaline earth metal, the protective coating being transparent to the light, stable when exposed to the light and stable when exposed to the liquid.

10. The method as claimed in claim 9, wherein said step of forming the protective coating further includes forming a mixture of the fluoride of the alkaline earth metal with the nitride.

11. The method as claimed in claim 9, wherein said step of forming the protective coating includes plasma implanting nitrogen into the fluoride at the surface of the optical element.

12. The method as claimed in claim 11, wherein said step of forming the protective coating further includes supplying silane to a chamber in which the plasma implanting is performed.

13. The method as claimed in claim 9, wherein said step of forming the protective coating includes exposing the fluoride at the surface of the optical element to silane such that the protective coating incorporates silicon nitride.

14. The method as claimed in claim 9, wherein said step of forming the protective coating includes exposing the surface of the optical element to a source of ammonia and a diketonate of the alkaline earth metal.

15. The method as claimed in claim 9, wherein said step of forming the protective coating includes a step of causing the alkaline earth metal at the surface of the optical element to react with an azide and a step of causing the azide to decompose to form the nitride, the nitride including a nitride of the alkaline earth metal.

16. The method as claimed in claim 15, further comprising repeating in succession said steps of reacting the alkaline earth metal with the azide and causing the azide to decompose.

17. An optical element for an imaging system usable to pattern an article, comprising:
    a face adapted to contact a liquid including water occupying a space between said face and an article to be patterned with the imaging system;
    a fluoride of an alkaline earth metal at said face, said fluoride being degradable by the liquid; and
    a protective coating including at least one nitride of the alkaline earth metal, said protective coating covering said fluoride at said face to protect said face from the liquid, said protective coating being transparent to the light, stable when exposed to the light and stable when exposed to the liquid.

* * * * *